US012776623B2

(12) United States Patent
Fülöp et al.

(10) Patent No.: US 12,776,623 B2
(45) Date of Patent: Oct. 27, 2026

(54) CONCAVE LASER APERTURE FOR HIGH-BANDWIDTH COMMUNICATION

(71) Applicant: Mellanox Technologies, Ltd., Yokneam (IL)

(72) Inventors: Attila Fülöp, Gothenburg (SE); Petter Westbergh, Gothenburg (SE); Steffan Intemann, Blaustein (DE)

(73) Assignee: Mellanox Technologies, Ltd., Yokneam (IL)

( * ) Notice: Subject to any disclaimer, the term of this patent is extended or adjusted under 35 U.S.C. 154(b) by 630 days.

(21) Appl. No.: 18/200,655

(22) Filed: May 23, 2023

(65) Prior Publication Data

US 2024/0396302 A1 Nov. 28, 2024

(51) Int. Cl.
*H01S 5/183* (2006.01)

(52) U.S. Cl.
CPC ...... *H01S 5/18338* (2013.01); *H01S 5/18313* (2013.01); *H01S 2301/02* (2013.01); *H01S 2301/16* (2013.01)

(58) Field of Classification Search
CPC ........................... H01S 5/18338; H01S 5/1835
See application file for complete search history.

(56) References Cited

U.S. PATENT DOCUMENTS

| | | | | |
|---|---|---|---|---|
| 11,563,307 B2 | | 1/2023 | Kalifa | |
| 11,721,952 B2 | | 8/2023 | Kalifa | |
| 2003/0179802 A1 | * | 9/2003 | Albrecht | H01S 5/04254 372/50.1 |
| 2019/0089127 A1 | * | 3/2019 | Gazula | H01S 5/18311 |
| 2019/0372301 A1 | * | 12/2019 | Onishi | H01S 5/0206 |
| 2020/0244040 A1 | * | 7/2020 | Wang | H01S 5/18311 |
| 2020/0358252 A1 | * | 11/2020 | Hoser | H01S 5/18361 |
| 2022/0385040 A1 | * | 12/2022 | Kubota | H01S 5/3202 |
| 2024/0128722 A1 | * | 4/2024 | Hamaguchi | H01S 5/34333 |
| 2024/0250501 A1 | * | 7/2024 | Sekita | H01S 5/1835 |

OTHER PUBLICATIONS

Westbergh, P., pending U.S. Appl. No. 17/865,597, filed Jul. 15, 2022.

Iakovlev, V. et al., pending U.S. Appl. No. 18/144,984, filed May 9, 2023.

Hjort, F. et al., pending U.S. Appl. No. 18/140,028, filed Apr. 27, 2023.

Hjort, F. et al., pending U.S. Appl. No. 18/140,034, filed Apr. 27, 2023.

* cited by examiner

*Primary Examiner* — James A Menefee
(74) *Attorney, Agent, or Firm* — Alston & Bird LLP

(57) ABSTRACT

Some embodiments of the present invention are directed to an aperture for a laser for high-bandwidth communication. The laser may include an active region configured to emit light parallel to an optical axis and an emission surface spaced from the active region and through which the light is emitted. The laser may also include an aperture positioned along the optical axis between the active region and the emission surface, where the aperture has a cross-sectional area in a plane perpendicular to the optical axis, and where the cross-sectional area defines a non-circular shape. In some embodiments, the non-circular shape may have at most one axis of symmetry. The aperture may be configured to reduce a spectral bandwidth of the light emitted by the laser and a relative intensity noise of the laser.

21 Claims, 6 Drawing Sheets

CONCAVE LASER APERTURE FOR HIGH-BANDWIDTH COMMUNICATION

FIELD OF THE INVENTION

The present invention relates to an aperture for a laser for high-bandwidth communication.

BACKGROUND

With demand for high-speed and high-volume data communication increasing, communications providers are increasingly adopting optics-based communication solutions. To meet these demands, high-speed transmitters are being developed.

SUMMARY

The following presents a simplified summary of one or more embodiments of the present invention, in order to provide a basic understanding of such embodiments. This summary is not an extensive overview of all contemplated embodiments and is intended to neither identify key or critical elements of all embodiments nor delineate the scope of any or all embodiments. This summary presents some concepts of one or more embodiments of the present invention in a simplified form as a prelude to the more detailed description that is presented later.

In one aspect, the present invention is directed to a laser including an active region, an emission surface, and an aperture. The active region may be configured to emit light along and parallel to an optical axis. The emission surface may be spaced from the active region, and the light may be emitted through the emission surface. The aperture may be positioned along the optical axis between the active region and the emission surface and may have a cross-sectional area in a plane perpendicular to the optical axis. The cross-sectional area may define a non-circular shape, where the non-circular shape has at most one axis of symmetry. The aperture may be configured to reduce (i) a spectral bandwidth of the light emitted by the laser and (ii) a relative intensity noise of the laser.

In some embodiments, the non-circular shape may have a centroid and include at least one inwardly-curved portion with respect to the centroid. Additionally, or alternatively, the centroid may be positioned on the optical axis. In some embodiments, a first distance between a first point on the at least one inwardly-curved portion and the centroid is smaller than a second distance between any other point not on the inwardly-curved portion on the non-circular shape and the centroid. For example, the first distance may be at least two times smaller than the second distance between any other point not on the inwardly-curved portion on the non-circular shape and the centroid.

In some embodiments, the non-circular shape may correspond to an ellipse having a concave portion along a minor elliptical axis.

In some embodiments, the aperture may be configured to attenuate a fundamental mode of the light emitted by the laser.

In some embodiments, the non-circular shape may be asymmetrical.

In some embodiments, the non-circular shape may be configured to separate two or more higher-order modes of the light emitted by the laser.

In some embodiments, the aperture may be configured to reduce the relative intensity noise of the laser by shifting intermodal beat notes outside of a frequency band at which the laser is configured to transmit signals.

In some embodiments, the aperture may be configured to laterally confine the light and a current applied to the laser.

In some embodiments, the laser may have a spectral root-mean-square bandwidth of less than 0.6 nanometers.

In some embodiments, the relative intensity noise of the laser is less than about −145 dBc/Hz.

In another aspect, the present invention is directed to a vertical-cavity surface-emitting laser (VCSEL) including an active region, an emission surface, a first mirror region, a second mirror region, and an aperture. The active region may be configured to emit light along and parallel to an optical axis. The emission surface may be spaced from the active region, and the light may be emitted through the emission surface. The first mirror region may be positioned along the optical axis between the active region and the emission surface. The second mirror region may be positioned along the optical axis on an opposite side of the active region from the first mirror region. The aperture may be positioned along the optical axis between the active region and the emission surface. The aperture may have a cross-sectional area in a plane perpendicular to the optical axis, where the cross-sectional area defines a non-circular shape. The non-circular shape may be asymmetrical and may have a centroid. The non-circular shape may include at least one inwardly-curved portion with respect to the centroid. The aperture may be configured to reduce (i) a spectral bandwidth of the light emitted by the VCSEL and (ii) a relative intensity noise of the VCSEL.

In some embodiments, the centroid may be positioned along the optical axis.

In some embodiments, the first mirror region may include a first distributed Bragg reflector, and the second mirror region may include a second distributed Bragg reflector.

In some embodiments, the laser may have a spectral root-mean-square bandwidth of less than 0.6 nanometers.

In some embodiments, the relative intensity noise of the laser may be less than about −145 dBc/Hz.

In yet another aspect, the present invention is directed to a method of manufacturing a vertical-cavity surface-emitting laser (VCSEL). The method may include determining, based on characteristics of a VCSEL, an optimized cross-sectional area for a circular-shaped theoretical aperture for the VCSEL. The method may include selecting, for the VCSEL, a non-circular shape for an actual aperture of the VCSEL having a cross-sectional area that is approximately equal to the optimized cross-sectional area for the circular-shaped theoretical aperture, where the non-circular shape has at most one axis of symmetry. The method may include manufacturing the VCSEL including the actual aperture having the cross-sectional area in a plane perpendicular to an optical axis of the VCSEL, where the aperture has the non-circular shape.

In some embodiments, selecting the non-circular shape for the actual aperture may include manipulating a perimeter of the optimized cross-sectional area for the circular-shaped theoretical aperture to include at least one of a perturbation or an inwardly-curved portion to form the non-circular shape for the aperture.

The features, functions, and advantages that have been discussed may be achieved independently in various embodiments of the present invention or may be combined with yet other embodiments, further details of which may be seen with reference to the following description and drawings.

BRIEF DESCRIPTION OF THE DRAWINGS

Figure 1A:
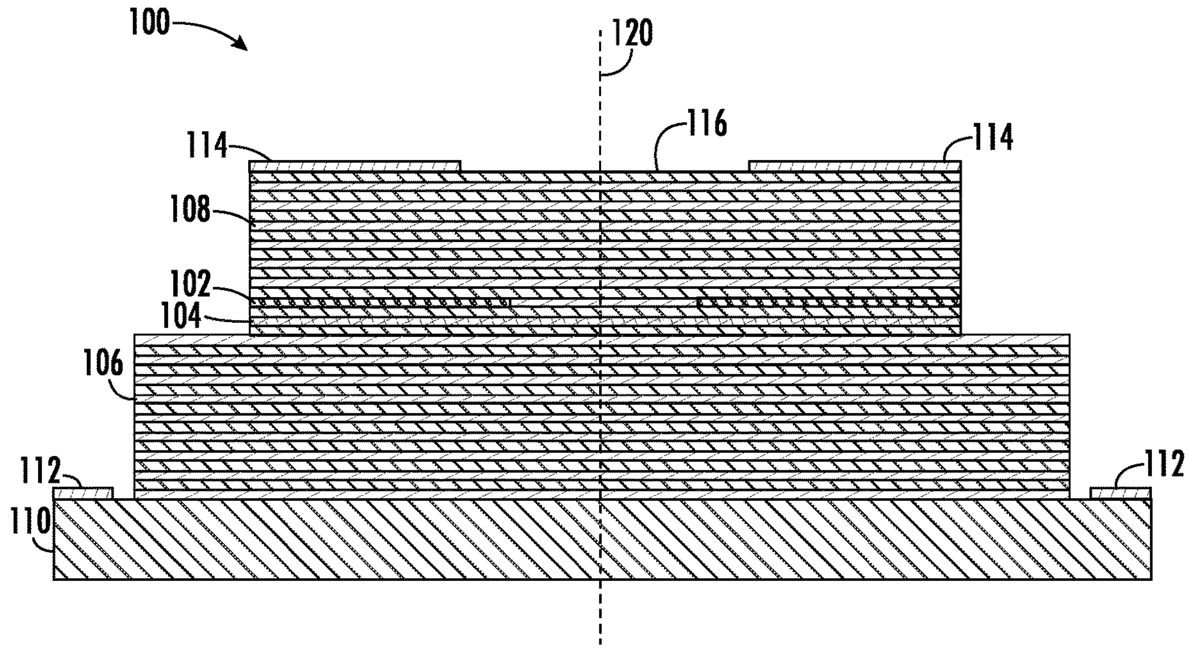
Figure 1B:
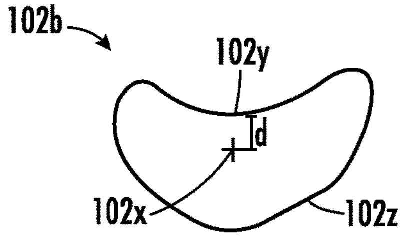
Figure 1C:
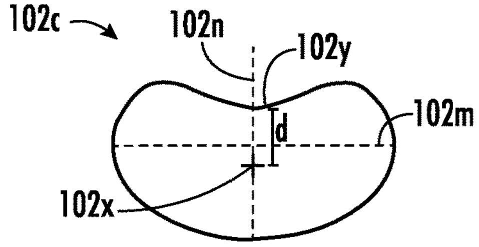
Figure 2:
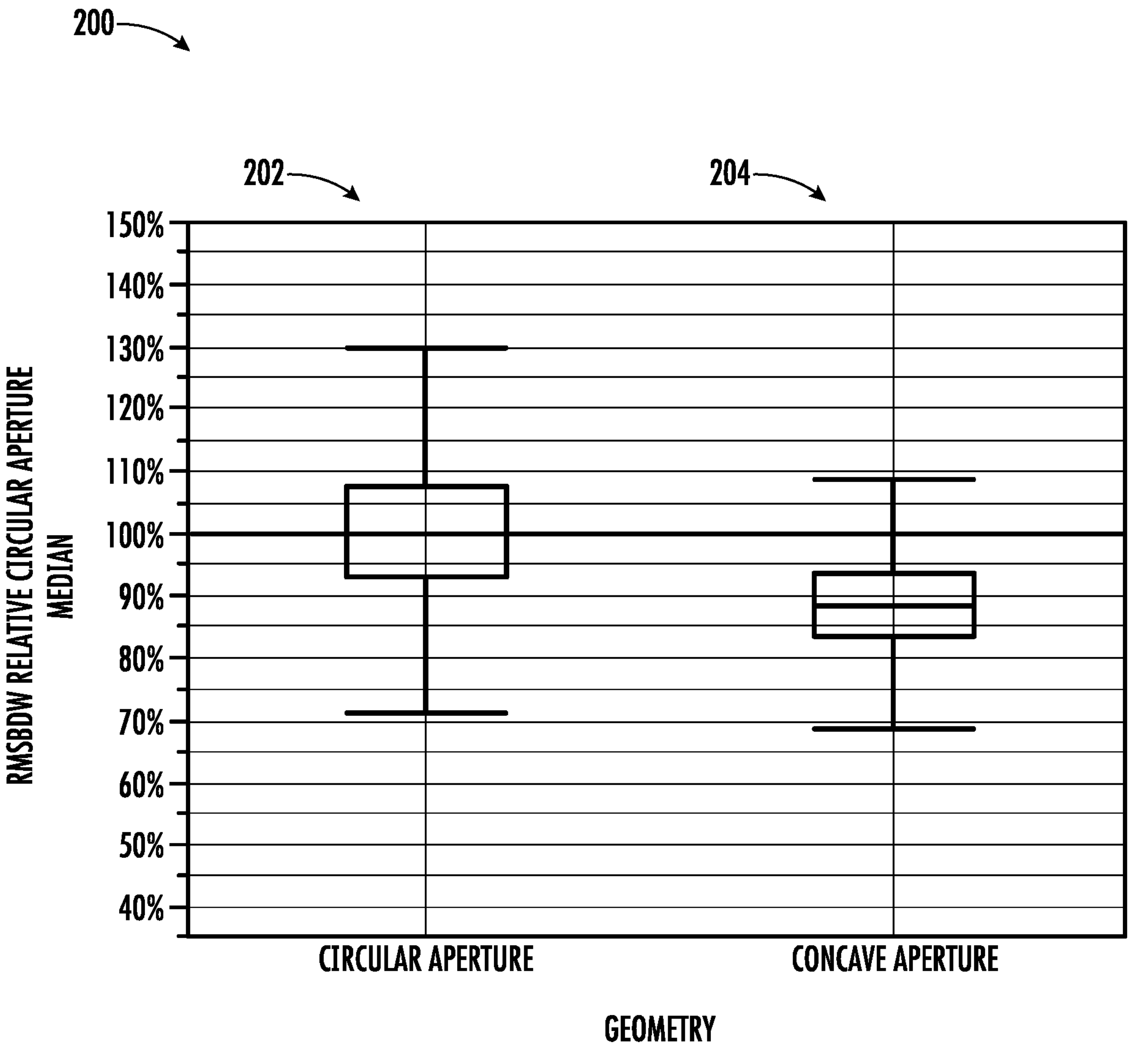
Figure 3:
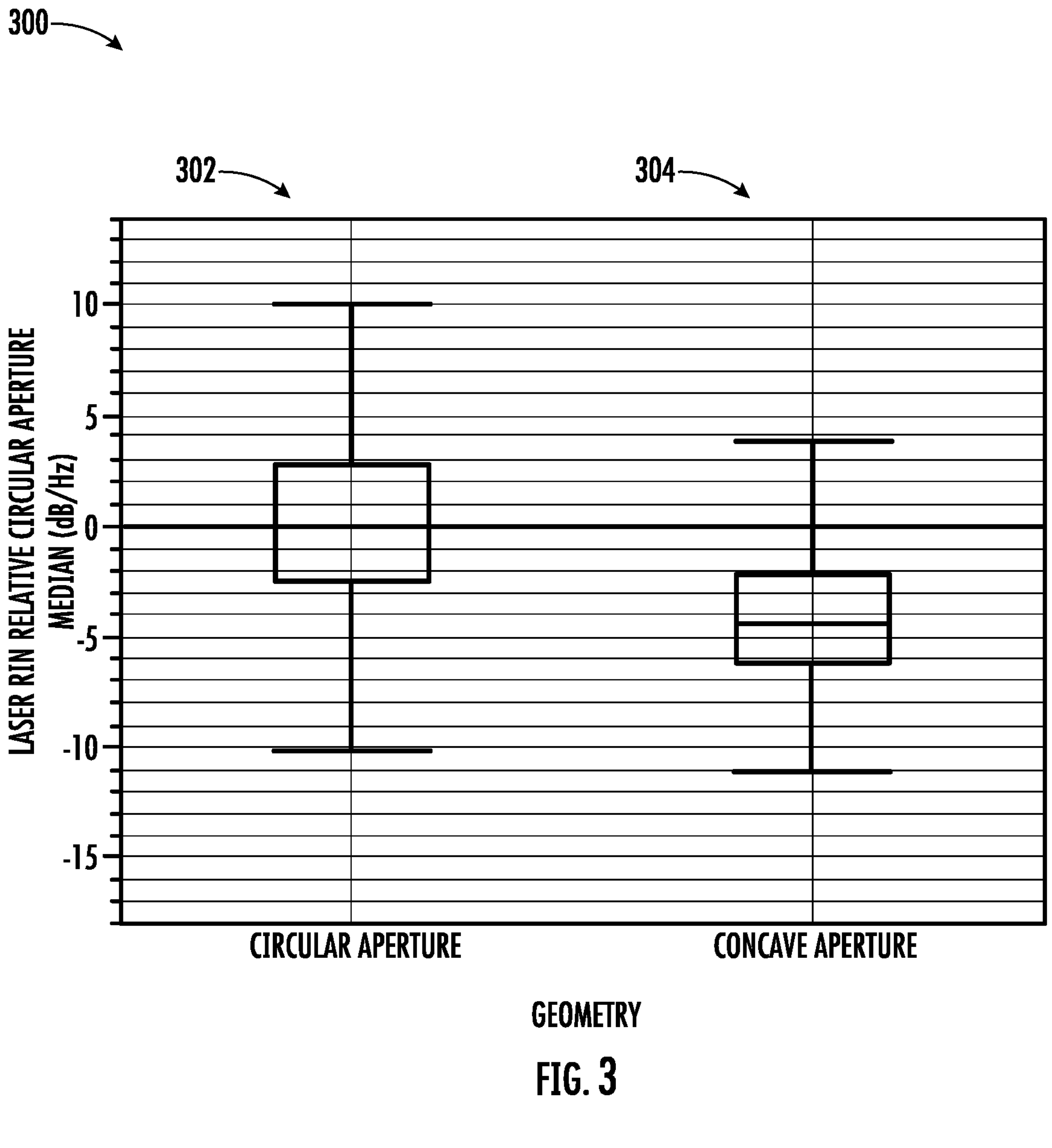
Figure 4:
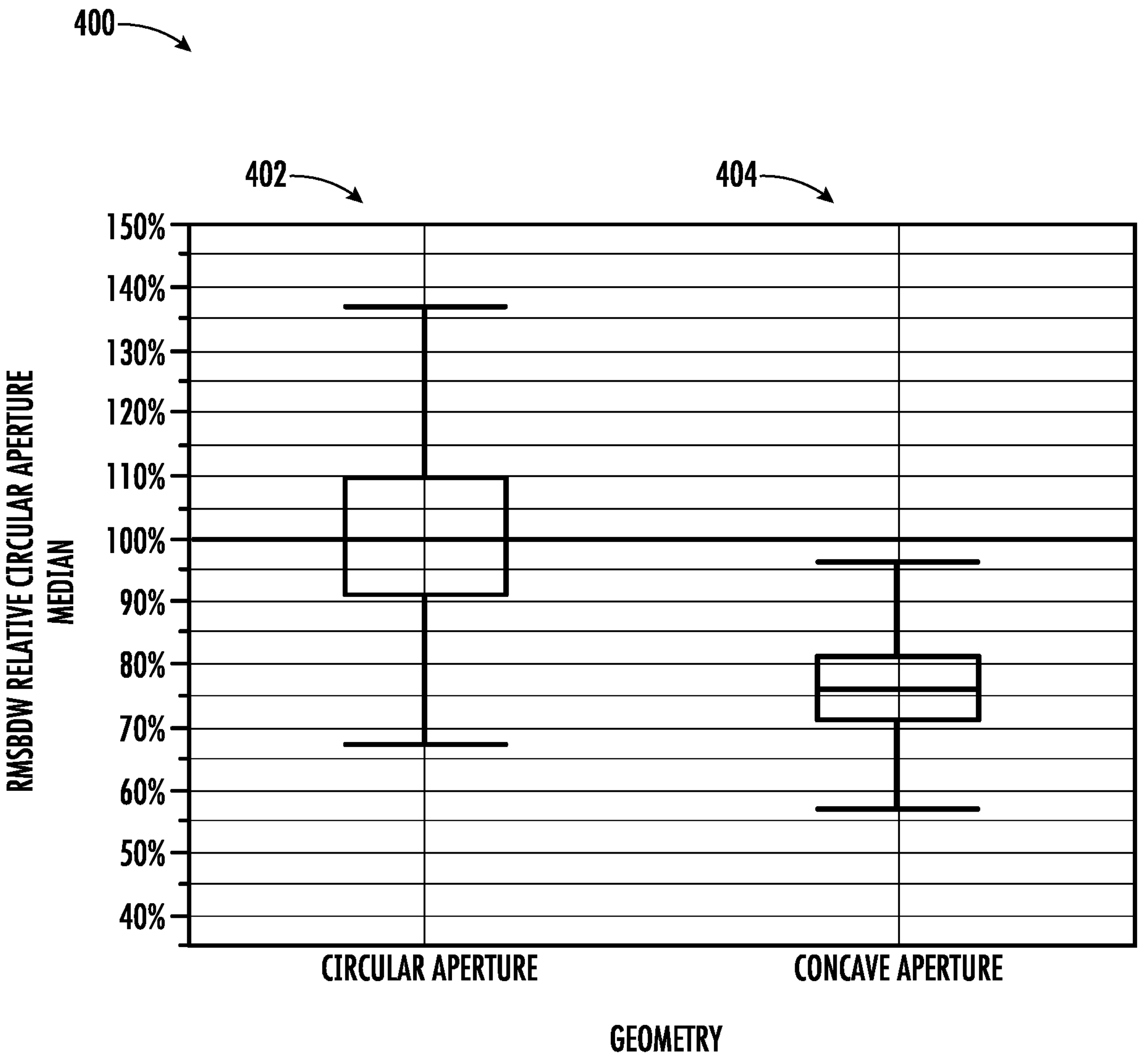
Figure 5:
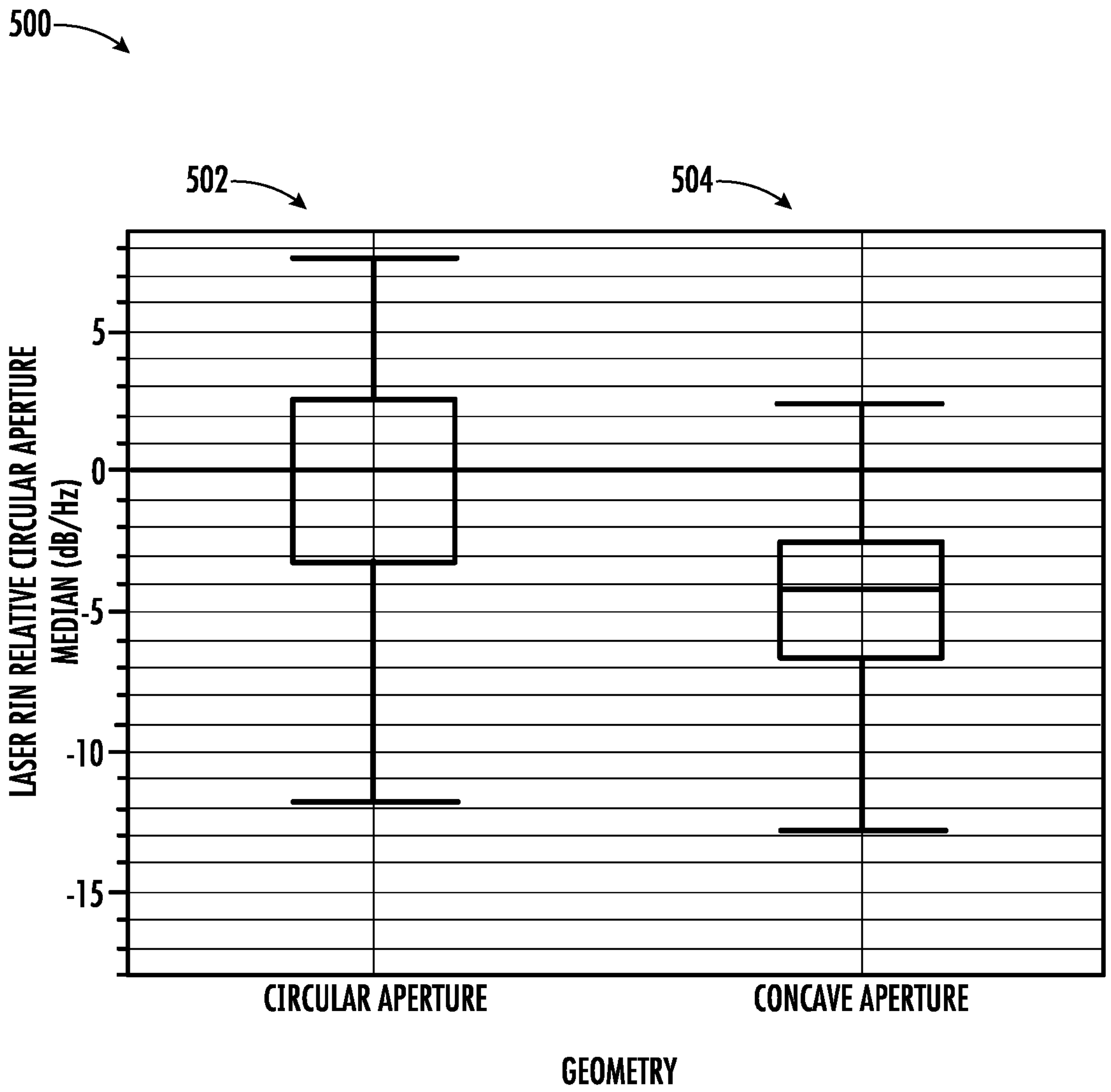
Figure 6:
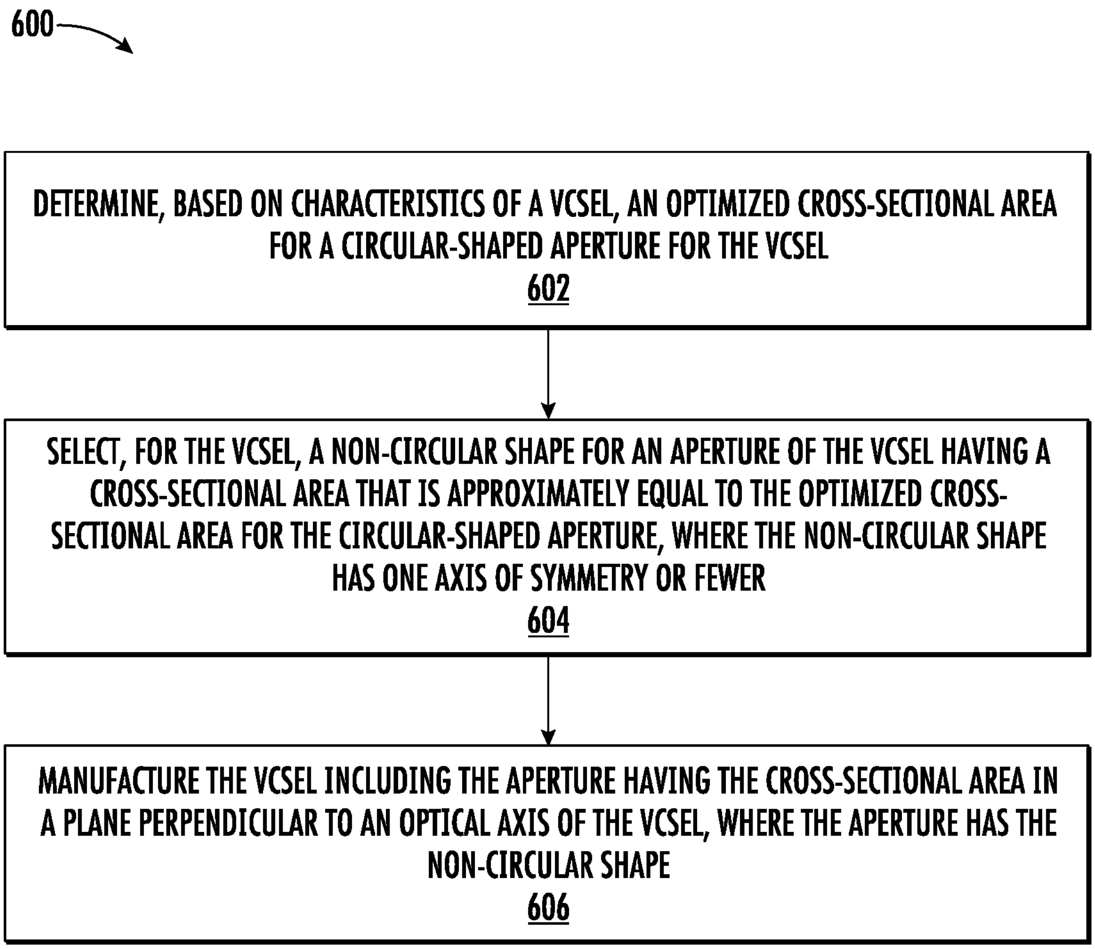

Having thus described embodiments of the invention in general terms, reference will now be made to the accompanying drawings, wherein:

FIG. 1A illustrates a schematic cross-section of a layer structure of a laser, in accordance with an embodiment of the invention;

FIG. 1B illustrates an overhead view of a cross-section of an aperture of the laser of FIG. 1A, in accordance with an embodiment of the invention;

FIG. 1C illustrates an overhead view of a cross-section of another aperture of the laser of FIG. 1A, in accordance with an embodiment of the invention;

FIG. 2 is a graph showing spectral root-mean-square bandwidth (RMSBDW) for a first set of lasers having circular apertures and spectral RMSBDW for a first set of lasers having concave apertures, in accordance with an embodiment of the invention;

FIG. 3 is a graph showing relative intensity noise (RIN) for the first set of lasers having circular apertures and RIN for the first set lasers having concave apertures, in accordance with an embodiment of the invention;

FIG. 4 is a graph showing relative spectral RMSBDW for a second set of lasers having circular apertures and relative spectral RMSBDW for a second set of lasers having concave apertures, in accordance with an embodiment of the invention;

FIG. 5 is a graph showing relative RIN for the second set of lasers having circular apertures and relative RIN for the second set lasers having concave apertures, in accordance with an embodiment of the invention; and FIG. 6 illustrates a method for manufacturing a vertical-cavity surface-emitting laser (VCSEL), in accordance with an embodiment of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Furthermore, when it is said herein that something is "based on" something else, it may be based on one or more other things as well. In other words, unless expressly indicated otherwise, as used herein "based on" means "based at least in part on" or "based at least partially on." Also, as used herein, the term "or" is intended to be inclusive when used in a series and may be used interchangeably with "and/or," unless explicitly stated otherwise (e.g., if used in combination with "either" or "only one of"). As used herein, terms such as "top," "about," "around," and/or the like are used for explanatory purposes in the examples provided below to describe the relative position of components or portions of components. As used herein, the terms "substantially" and "approximately" refer to tolerances within manufacturing and/or engineering standards. Like numbers refer to like elements throughout. No element, act, or instruction used herein should be construed as critical or essential unless explicitly described as such.

As noted, demand for high-speed and high-volume data communication is increasing, and communications providers are increasingly adopting optics-based communication solutions. To meet these demands, high-speed transmitters are being developed. Such high-speed transmitters may include different types of lasers, such as top-emitting lasers, bottom-emitting lasers, edge-emitting lasers, GaAs-based lasers, InP-based lasers, directly modulated lasers, distributed-feedback lasers, and/or the like. For example, vertical-cavity surface-emitting lasers (VCSELs) may include oxide apertures for electrical current confinement and optical guiding, which increase the speeds at which VCSEL-based transmitters can operate. Such oxide apertures may be formed by selectively, laterally oxidizing a layer of, for example, AlGaAs in a VCSEL. The shape of the oxide aperture influences the transverse optical guiding, which determines the spectral characteristics of light emitted by the VCSEL. Conventional VCSELs are inherently multimode and emit light at several discrete wavelengths simultaneously. Due to chromatic dispersion in optical fibers that transmit light signals from VCSELs, the multimode nature of conventional VCSELs limits the speeds at which such VCSEL-based transmitters can operate.

Additionally, when two light waves having different frequencies, such as two lateral modes emitted by a VCSEL, interfere with each other and are incident on a photodiode receiver, an electrical signal is generated that has a frequency corresponding to the difference between the frequencies of the light waves. Such electrical signals are referred to as intermodal beat notes. If the difference between the frequencies is low enough to be within the electrical bandwidth of the data signal, the intermodal beat note generates noise, which increases the relative intensity noise (RIN) of the VCSEL. The contribution of intermodal beat notes to RIN is low enough that it does not impact typical data rates. However, to achieve higher data rates, system noise must be reduced to low enough levels that such intermodal beat notes impact performance of transmitter/receiver systems.

Some embodiments of the present invention are directed to an aperture for a laser for high-bandwidth communication. In particular, the aperture may be designed for VCSELs and may include at least one side that is concave. The aperture may be configured to reduce the spectral bandwidth of the light emitted by the laser and the RIN of the laser. In some embodiments, the aperture may have a cross-sectional area in a plane perpendicular to an optical axis of the laser, where the shape of the cross-sectional area has at most one axis of symmetry. The aperture may have a centroid, or geometric center, and at least one side of the aperture may be curved inward toward the centroid. To maintain current flow, the cross-sectional area of the aperture may be configured to have the same cross-sectional area as a conventional circular aperture that would otherwise have been used for the particular application. In some embodiments, the aperture may be configured to slightly attenuate the fundamental mode of the light emitted by the laser (e.g., due to the inwardly curved edge of the aperture). The shape of the aperture may disrupt the X/Y symmetry of the laser such that higher order modes are separated from each other if not fully attenuated and intermodal beat notes are shifted outside of a frequency band at which the laser is configured to transmit signals, thereby reducing the RIN of the laser. By reducing the laser's spectral bandwidth and RIN, the laser is capable of higher bandwidth communication.

FIG. 1A illustrates a schematic cross-section of a layer structure of a laser 100, in accordance with an embodiment of the invention. In particular, the cross-section of FIG. 1A is taken in a plane that is substantially parallel to an optical axis 120 of the laser 100, where the optical axis is the nominal axis of the light emitted by the VCSEL. As shown in FIG. 1A, the layer structure may include an oxide aperture 102, an active region 104, a first mirror region 106, a second mirror region 108, a substrate 110, first contacts 112, second contacts 114, and an emission surface 116. The layer structure of the laser 100 may be formed on the substrate 110. In some embodiments, the laser 100 may be configured to emit light having a wavelength of between about 740 nanometers and 1,100 nanometers.

As shown in FIG. 1A, the active region 104 may be positioned between the first mirror region 106 and the second mirror region 108. The oxide aperture 102 may be formed in a mirror layer of the second mirror region 108 and may be configured to laterally confine light and a current applied to the laser. In some embodiments, the oxide aperture 102 may be between the active region 104 and the second mirror region 108. The active region 104 may include, for example, one or more quantum wells.

In some embodiments, the first mirror region 106 (e.g., an n-type mirror region) and the second mirror region 108 (e.g., a p-type mirror region) may include distributed Bragg reflectors formed of multiple alternating semiconductor layers (e.g., of GaAs and AlGaAs), and they may vertically confine light generated in the active region 104. In this regard, the active region 104 may define an active region plane (e.g., a horizontal plane in the orientation of FIG. 1A) and emit light along and parallel to the optical axis 120 of the laser 100 and through the emission surface 116, where the optical axis 120 is perpendicular to the active region plane.

As shown in FIG. 1A, the first contacts 112 may be positioned on the substrate 110, and the second contacts 114 may be positioned on a surface (e.g., an upper surface) of the second mirror region 108. The first contacts 112 and the second contacts 114 may provide electrical contacts for driving the laser 100.

As will be appreciated by one of ordinary skill in the art in light of this disclosure, the laser 100 may include other elements, such as metal contacts, one or more trenches, one or more coatings (e.g., an anti-reflective coating and/or the like), one or more insulators, one or more lenses, and/or the like. Although the laser 100 depicted in FIG. 1A is a top-emitting VCSEL, other embodiments in accordance with the present invention may include bottom-emitting VCSELs and/or other types of VCSELs including one or more oxide apertures.

FIG. 1B illustrates an overhead view of a cross-section of an aperture 102*b* that may be used as the oxide aperture 102 of the laser 100 of FIG. 1A, in accordance with an embodiment of the invention. FIG. 1C illustrates an overhead view of a cross-section of another aperture 102*c* that may be used as the oxide aperture 102 of the laser 100 of FIG. 1A, in accordance with an embodiment of the invention. With respect to FIG. 1, the cross-sections of FIGS. 1B and 1C are taken in a plane including the oxide aperture 102, where the plane is substantially perpendicular to the optical axis 120. As noted with respect to FIG. 1A, mirror regions (e.g., the first mirror region 106 and the second mirror region 108) of a VCSEL may include multiple alternating semiconductor layers. In this regard, the apertures 102*b* and 102*c* may be formed by selectively oxidizing a mirror layer in such a mirror region.

As shown in FIGS. 1B and 1C, the apertures 102*b* and 102*c* may have a cross-sectional area in a plane perpendicular to the optical axis 120, where the cross-sectional area defines a non-circular shape. As shown in FIGS. 1B and 1C, the non-circular shape may have a centroid 102*x* and may include an inwardly-curved portion 102*y* with respect to the centroid 102*x*. As shown in FIG. 1B, the non-circular shape of the aperture 102*b* may also include another perturbation 102*z*. In this regard, each of the non-circular shapes of the apertures 102*b* and 102*c* may correspond to a circular shape centered at the centroid 102*x* that has one or more perturbations, concave portions, and/or the like. The centroid 102*x* may correspond to the geometric centers of the cross-sectional areas of the apertures 102*b* and 102*c*. In some embodiments, the centroid 102*x* may be positioned on the optical axis 120 of the laser 100.

As shown in FIGS. 1B and 1C, the non-circular shape may include a perturbation in the form of the inwardly-curved portion 102*y*, which curves inwardly toward the centroid 102*x*. In some embodiments, a distance d between a point on the inwardly-curved portion 102*y* and the centroid 102*x* may be smaller than another distance between any other point not on the inwardly-curved portion 102*y* on the non-circular shape and the centroid 102*x*, as shown in FIGS. 1B and 1C. For example, the distance d may be at least two times smaller than another distance between any other point not on the inwardly-curved portion 102*y* on the non-circular shape and the centroid 102*x*.

As will be appreciated by one of ordinary skill in the art in view of this disclosure, the inwardly-curved portion 102*y* may be considered a concave portion of the non-circular shape due to its inward curve toward the centroid 102*x*. In this regard, each of the apertures 102*b* and 102*c* may be referred to as a concave aperture because of its non-circular shape having a concave portion.

As shown in FIG. 1B, the non-circular shape may include the other perturbation 102*z*, which interrupts an otherwise smoothly-curved portion of the non-circular shape. In this regard, the other perturbation 102*z* may or may not curve inwardly toward the centroid 102*x*.

As shown in FIG. 1C, the non-circular shape may correspond to an ellipse having a major axis 102*m* and a Minor Axis 102*n* as Well as the Inwardly-Curved Portion 102*y* (e.g., a concave portion) along the minor axis 102*n* toward the major axis 102*m*. In some embodiments, the non-circular shape may correspond to an ellipse having an inwardly-curved portion (e.g., a concave portion) along the major axis 102*m* toward the minor axis 102*n*.

In some embodiments, the non-circular shape may have at most one axis of symmetry (e.g., one axis of symmetry or fewer). In this regard, the non-circular shape may correspond to a circular shape that has one or more perturbations, where the perturbations break at least one axis of symmetry of the circular shape. For example, the aperture 102*b* of FIG. 1B includes two perturbations (e.g., the inwardly-curved portion 102*y* and the perturbation 102*z*), which result in a non-circular shape of the aperture 102*b* that is asymmetrical.

As another example, the aperture 102*c* of FIG. 1C includes one perturbation, the inwardly-curved portion 102*y*, which results in a non-circular shape of the aperture 102*c* that has one axis of symmetry, namely the minor axis 102*n*.

In some embodiments, each of the non-circular shapes of the apertures 102*b* and 102*c* may be configured to reduce a spectral bandwidth of the light emitted by the laser and a relative intensity noise of the laser. In this regard, each of the non-circular shapes of the apertures 102*b* and 102*c* may suppress, decrease, and/or separate power in lateral modes (e.g., two or more higher-order modes) supported by an optical cavity of the laser, which reduces spectral flatness and the spectral bandwidth of the light emitted by the laser. For example, the inwardly-curved portion 102*y* and/or the perturbation 102*z* may inhibit development of the lateral modes. Additionally, the lack of symmetry in the non-circular shape of the aperture 102*b* and/or the single axis of symmetry in the non-circular shape of the aperture 102*c* may split any degeneracies between the modes that may be supported by the optical cavity of the laser. Splitting such degeneracies may reduce the likelihood of the formation of intermodal beat notes and/or shift any intermodal beat notes outside of a frequency band at which the laser is configured to transmit signals. By suppressing the lateral modes and splitting any degeneracies between supported modes, the non-circular shape of the aperture 102*b* may reduce spectral width and relative intensity noise of light emitted by the laser, which improves the laser's suitability for high data rate communication.

In some embodiments, the inwardly-curved portion 102*y* and/or the perturbation 102*z* may attenuate a fundamental mode of the light emitted by the laser. For example, the distance d between the inwardly-curved portion 102*y* and the centroid 102*x* may be selected to be small enough to attenuate the fundamental mode of the light emitted by the laser. Attenuating the fundamental mode in this manner may also reduce spectral bandwidth of the laser.

As will be appreciated by one of ordinary skill in the art in view of this disclosure, the apertures 102*b* and 102*c* are examples of apertures having cross-sectional areas defining non-circular shapes that have at most one axis of symmetry (e.g., one axis of symmetry or fewer). Other embodiments of apertures in accordance with the present invention may have cross-sectional areas defining other non-circular shapes that have at most one axis of symmetry. For example, an aperture may have a cross-sectional area defining a non-circular shape that corresponds to an ellipse having an inwardly-curved portion that is not positioned along either a major axis or a minor axis, an ellipse having one or more inwardly-curved portions, an ellipse that has one or more inwardly-curved portions and one or more perturbations (e.g., similar to the perturbation 102*z* of FIG. 1B), and/or the like. As another example, an aperture may have a cross-sectional area defining a non-circular shape including straight sides, such as a polygon, that has at most one axis of symmetry. As yet another example, an aperture may have a cross-sectional area defining a non-circular shape including one or more straight sides and one or more curved sides that has at most one axis of symmetry.

FIG. 2 is a graph 200 showing spectral root-mean-square bandwidth (RMSBDW) for a first set of lasers having circular apertures and spectral RMSBDW for a first set of lasers having concave apertures, in accordance with an embodiment of the invention. In particular, the concave apertures may have non-circular shapes similar to the aperture 102*c* shown and described herein with respect to FIG. 1B. Additionally, the circular apertures and the concave apertures referenced with respect to FIG. 2 have approximately the same cross-sectional area. The spectral RMSBDW values represented in FIG. 2 were obtained with the VCSELs biased at their target operating current.

As noted, the non-circular shapes of concave apertures may be configured to reduce a spectral bandwidth of light emitted by lasers that include such concave apertures. In this regard, the graph 200 includes plot 202 showing relative spectral RMSBDW values for the first set of lasers having circular apertures and plot 204 showing relative spectral RMSBDW values for the first set of lasers having concave apertures. As shown by the plots 202 and 204, on average the lasers having concave apertures have lower spectral RMSBDW values as compared to the lasers having circular apertures. In particular, the lasers having concave apertures may have spectral RMSBDW values that are at least ten percent less than the spectral RMSBDW values of the lasers having circular apertures on average.

Furthermore, the graph 200 of FIG. 2 shows the standard deviations of the spectral RMSBDW values of the lasers having circular apertures and the standard deviation of the spectral RMSBDW values of the lasers having concave apertures. As shown in FIG. 2, the spectral RMSBDW values of the lasers having concave apertures have a significantly lower standard deviation as compared to the spectral RMSBDW values of the lasers having circular apertures. Accordingly, lasers having concave apertures in accordance with embodiments of the present invention may have significantly lower part-to-part variability with respect to spectral RMSBDW as compared to conventional lasers having circular apertures.

FIG. 3 is a graph 300 showing relative intensity noise (RIN) for the first set of lasers having circular apertures and RIN for the first set lasers having concave apertures, in accordance with an embodiment of the invention. The RIN values represented in FIG. 3 were obtained with the VCSELs biased at their target operating current.

As noted, the non-circular shapes of concave apertures may be configured to reduce the RIN of lasers that include such concave apertures. In this regard, the graph 300 includes plot 302 showing RIN values for the first set of lasers having circular apertures and plot 304 showing RIN values for the first set of lasers having concave apertures. As shown by the plots 302 and 304, on average the lasers having concave apertures have lower RIN values as compared to the lasers having circular apertures with the same cross-sectional area of the concave apertures. In particular, the lasers having concave apertures may have RIN values that are about 5 dB/Hz less than the RIN values of the lasers having circular apertures on average. In some embodiments, the lasers having concave apertures may have RIN values that are less than about −145 dBc/Hz.

Furthermore, the graph 300 of FIG. 3 plots the standard deviation of the RIN values of the lasers having circular apertures and the standard deviation of the RIN values of the lasers having concave apertures. As shown in FIG. 3, the RIN values of the lasers having concave apertures have a significantly lower standard deviation as compared to the RIN values of the lasers having circular apertures. Accordingly, lasers having concave apertures in accordance with embodiments of the present invention may have significantly lower part-to-part variability with respect to RIN as compared to conventional lasers having circular apertures, where the circular and concave apertures have approximately the same cross-sectional area.

FIG. 4 is a graph 400 showing relative spectral RMSBDW for a second set of lasers having circular apertures and relative spectral RMSBDW for a second set of lasers having concave apertures, in accordance with an embodiment of the invention. In particular, the concave apertures may have non-circular shapes similar to the aperture 102*c* shown and described herein with respect to FIG. 1B. Additionally, the circular apertures and the concave apertures referenced with respect to FIG. 4 have approximately the same cross-sectional area. The relative spectral RMSBDW values represented in FIG. 4 were obtained with the VCSELs biased at their target operating current. As compared to the first set of lasers having concave apertures, the second set of lasers with concave apertures has different aperture sizes (e.g., cross-sectional areas) and one or more inwardly-curved portions having different concavities.

As noted, the non-circular shapes of concave apertures may be configured to reduce a spectral bandwidth of light emitted by lasers that include such concave apertures. In this regard, the graph 400 includes plot 402 showing relative spectral RMSBDW values for the second set of lasers having circular apertures and plot 404 showing relative spectral RMSBDW values for the second set of lasers having concave apertures. As shown by the plots 402 and 404, on average the lasers having concave apertures have lower spectral RMSBDW values as compared to the lasers having circular apertures. In particular, the lasers having concave apertures may have spectral RMSBDW values that are at least twenty percent less than the spectral RMSBDW values of the lasers having circular apertures on average.

Furthermore, the graph 400 of FIG. 4 shows the standard deviations of the spectral RMSBDW values of the lasers having circular apertures and the standard deviation of the spectral RMSBDW values of the lasers having concave apertures. As shown in FIG. 4, the spectral RMSBDW values of the lasers having concave apertures have a significantly lower standard deviation as compared to the spectral RMSBDW values of the lasers having circular apertures. Accordingly, lasers having concave apertures in accordance with embodiments of the present invention may have significantly lower part-to-part variability with respect to spectral RMSBDW as compared to conventional lasers having circular apertures.

FIG. 5 is a graph 500 showing relative RIN for the second set of lasers having circular apertures and relative RIN for the second set lasers having concave apertures, in accordance with an embodiment of the invention. The relative RIN values represented in FIG. 5 were obtained with the VCSELs biased at their target operating current.

As noted, the non-circular shapes of concave apertures may be configured to reduce the RIN of lasers that include such concave apertures. In this regard, the graph 500 includes plot 502 showing relative RIN values for the second set of lasers having circular apertures and plot 504 showing relative RIN values for the second set of lasers having concave apertures. As shown by the plots 502 and 504, on average the lasers having concave apertures have lower RIN values as compared to the lasers having circular apertures with the same cross-sectional area of the concave apertures. In particular, the lasers having concave apertures may have median RIN values that are about 4-5 dB/Hz less than the RIN values of the lasers having circular apertures on average. In some embodiments, the lasers having concave apertures may have RIN values that are less than about −145 dBc/Hz.

Furthermore, the graph 500 of FIG. 5 plots the standard deviation of the RIN values of the lasers having circular apertures and the standard deviation of the RIN values of the lasers having concave apertures. As shown in FIG. 5, the RIN values of the lasers having concave apertures have a significantly lower standard deviation (e.g., about 4 dB/Hz) as compared to the standard deviation of the RIN values of the lasers having circular apertures (e.g., about 6 dB/Hz). Accordingly, lasers having concave apertures in accordance with embodiments of the present invention may have significantly lower part-to-part variability with respect to RIN as compared to conventional lasers having circular apertures, where the circular and concave apertures have approximately the same cross-sectional area.

FIG. 6 illustrates a method 600 for manufacturing a VCSEL, in accordance with an embodiment of the invention. In some embodiments, one or more steps from the method 600 may be used to manufacture a laser described herein with respect to FIGS. 1A-1C.

As shown in block 602, the method 600 may include determining, based on characteristics of a VCSEL, an optimized cross-sectional area for a circular-shaped theoretical aperture for the VCSEL. For example, the optimized cross-sectional area for a circular-shaped theoretical aperture may be determined based on a desired current density for the VCSEL, a desired voltage drop across the VCSEL, and/or the like.

As shown in block 604, the method 600 may include selecting, for the VCSEL, a non-circular shape for an actual aperture of the VCSEL having a cross-sectional area that is approximately equal to the optimized cross-sectional area for the circular-shaped theoretical aperture, where the non-circular shape has at most one axis of symmetry. For example, the method 600 may include manipulating a perimeter of a circular cross-sectional area of a circular aperture such that the perimeter has one or more perturbations, inwardly-curved portions, concave portions, and/or the like to form the non-circular shape for the aperture. In some embodiments, the method 600 may include selecting a non-circular shape similar to the non-circular shapes of the apertures 102*b* and 102*c* shown and described herein with respect to FIGS. 1B and 1C.

As shown in block 606, the method 600 may include manufacturing the VCSEL comprising the actual aperture having the cross-sectional area in a plane perpendicular to an optical axis of the VCSEL, where the actual aperture has the non-circular shape. For example, the method 600 may include selectively oxidizing a mirror layer of the VCSEL to form the actual aperture having the non-circular shape. As another example, the method 600 may include adjusting a mesa shape of the VCSEL and/or the oxidation time to achieve the actual aperture having the non-circular shape.

The method 600 may include additional embodiments, such as any single embodiment or any combination of embodiments described herein. Although FIG. 6 shows example blocks of a method 600, in some embodiments, the method 600 may include additional blocks, fewer blocks, different blocks, or differently arranged blocks than those depicted in FIG. 6. Additionally, or alternatively, two or more of the blocks of the method 600 may be performed in parallel.

As will be appreciated by one of ordinary skill in the art in view of this disclosure, the present invention may include and/or be embodied as an apparatus (including, for example, a photodetector, a device, and/or the like), as a method (including, for example, a manufacturing method, a computer-implemented process, and/or the like), or as any combination of the foregoing.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa.

While certain exemplary embodiments have been described and shown in the accompanying drawings, it is to be understood that such embodiments are merely illustrative of and not restrictive on the broad invention and that this invention is not to be limited to the specific constructions and arrangements shown and described, as various other changes, combinations, omissions, modifications and substitutions, in addition to those set forth in the above paragraphs, are possible. In light of this disclosure, those skilled in the art will appreciate that various adaptations, modifications, and combinations of the just described embodiments may be configured without departing from the scope and spirit of the invention. Therefore, it is to be understood that, within the scope of the appended claims, the invention may be practiced other than as specifically described herein.

What is claimed is:

1. A laser, comprising:

an active region configured to emit light along and parallel to an optical axis;

an emission surface spaced from the active region and through which the light is emitted; and an aperture positioned along the optical axis between the active region and the emission surface, wherein the aperture has a cross-sectional area in a plane perpendicular to the optical axis, wherein the cross-sectional area defines a non-circular shape, wherein the non-circular shape has at most one axis of symmetry, and wherein the non-circular shape corresponds to an ellipse having a concave portion along a minor elliptical axis;

wherein the aperture is configured to reduce (i) a spectral bandwidth of the light emitted by the laser and (ii) a relative intensity noise of the laser.

2. The laser of claim 1, wherein the non-circular shape has a centroid, and wherein the non-circular shape comprises at least one inwardly-curved portion with respect to the centroid.

3. The laser of claim 2, wherein the centroid is positioned on the optical axis.

4. The laser of claim 2, wherein a first distance between a first point on the at least one inwardly-curved portion and the centroid is smaller than a second distance between any other point not on the at least one inwardly-curved portion on the non-circular shape and the centroid.

5. The laser of claim 4, wherein the first distance is at least two times smaller than the second distance between any other point not on the at least one inwardly-curved portion on the non-circular shape and the centroid.

6. The laser of claim 1, wherein the aperture is configured to attenuate a fundamental mode of the light emitted by the laser.

7. The laser of claim 1, wherein the non-circular shape is asymmetrical.

8. The laser of claim 1, wherein the non-circular shape is configured to separate two or more higher-order modes of the light emitted by the laser.

9. The laser of claim 1, wherein the aperture is configured to reduce the relative intensity noise of the laser by shifting intermodal beat notes outside of a frequency band at which the laser is configured to transmit signals.

10. The laser of claim 1, wherein the aperture is configured to laterally confine the light and a current applied to the laser.

11. The laser of claim 1, wherein the laser has a spectral root-mean-square bandwidth of less than 0.6 nanometers.

12. The laser of claim 1, wherein the relative intensity noise of the laser is less than about −145 dBc/Hz.

13. A vertical-cavity surface-emitting laser (VCSEL), comprising:

an active region configured to emit light along and parallel to an optical axis;

an emission surface spaced from the active region and through which the light is emitted;

a first mirror region positioned along the optical axis between the active region and the emission surface;

a second mirror region positioned along the optical axis on an opposite side of the active region from the first mirror region; and an aperture positioned along the optical axis between the active region and the emission surface, wherein:

the aperture has a cross-sectional area in a plane perpendicular to the optical axis;

the cross-sectional area defines a non-circular shape corresponding to an ellipse having a concave portion along a minor elliptical axis;

the non-circular shape has a centroid; and the non-circular shape comprises at least one inwardly-curved portion with respect to the centroid;

wherein the aperture is configured to reduce (i) a spectral bandwidth of the light emitted by the VCSEL and (ii) a relative intensity noise of the VCSEL.

14. The VCSEL of claim 13, wherein the centroid is positioned along the optical axis.

15. The VCSEL of claim 13, wherein the first mirror region comprises a first distributed Bragg reflector, and wherein the second mirror region comprises a second distributed Bragg reflector.

16. The VCSEL of claim 13, wherein the VCSEL has a spectral root-mean-square bandwidth of less than 0.6 nanometers.

17. The VCSEL of claim 13, wherein the relative intensity noise of the VCSEL is less than about −145 dBc/Hz.

18. A method of manufacturing a vertical-cavity surface-emitting laser (VCSEL), the method comprising:

determining, based on characteristics of a VCSEL, an optimized cross-sectional area for a circular-shaped theoretical aperture for the VCSEL;

selecting, for the VCSEL, a non-circular shape for an actual aperture of the VCSEL having a cross-sectional area that is approximately equal to the optimized cross-sectional area for the circular-shaped theoretical aperture, wherein the non-circular shape does not have an axis of symmetry; and manufacturing the VCSEL comprising the actual aperture having the cross-sectional area in a plane perpendicular to an optical axis of the VCSEL, wherein manufacturing the VCSEL comprises selectively oxidizing a mirror layer of the VCSEL to form the actual aperture, wherein the actual aperture has the non-circular shape, and wherein the non-circular shape comprises at least one inwardly-curved portion with respect to a centroid of the non-circular shape and at least one perturbation that interrupts an otherwise smoothly-curved portion of the non-circular shape.

19. The method of claim 18, wherein manufacturing the VCSEL comprises defining:

an active region configured to emit light along and parallel to an optical axis;

an emission surface spaced from the active region and through which the light is emitted;

a first mirror region positioned along the optical axis between the active region and the emission surface; and a second mirror region positioned along the optical axis on an opposite side of the active region from the first mirror region, wherein the actual aperture is positioned along the optical axis between the active region and the emission surface.

20. The method of claim 18, wherein the actual aperture is configured to reduce (i) a spectral bandwidth of light emitted by the VCSEL and (ii) a relative intensity noise of the VCSEL.

21. A laser, comprising:

an active region configured to emit light along and parallel to an optical axis;

an emission surface spaced from the active region and through which the light is emitted; and an aperture positioned along the optical axis between the active region and the emission surface, wherein the aperture has a cross-sectional area in a plane perpendicular to the optical axis, wherein the cross-sectional area defines a non-circular shape and does not have an axis of symmetry, and wherein the non-circular shape comprises at least one inwardly-curved portion with respect to a centroid of the non-circular shape and at least one perturbation that interrupts an otherwise smoothly-curved portion of the non-circular shape;

wherein the aperture is configured to reduce (i) a spectral bandwidth of the light emitted by the laser and (ii) a relative intensity noise of the laser.

* * * * *